US008735990B2

(12) United States Patent
Anderson et al.

(10) Patent No.: US 8,735,990 B2
(45) Date of Patent: May 27, 2014

(54) RADIATION HARDENED FINFET

(75) Inventors: Brent A. Anderson, Jericho, VT (US);
Robert H. Dennard, Croton-on-Hudson, NY (US); Mark C. Hakey, Fairfax, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1384 days.

(21) Appl. No.: 11/679,869

(22) Filed: Feb. 28, 2007

(65) Prior Publication Data

US 2008/0203491 A1 Aug. 28, 2008

(51) Int. Cl.
H01L 21/70 (2006.01)
H01L 27/085 (2006.01)
H01L 29/06 (2006.01)

(52) U.S. Cl.
USPC ........... 257/372; 257/369; 257/618; 257/623; 257/E29.264

(58) Field of Classification Search
USPC ................... 257/E29.264, E29.274, E29.319, 257/E33.012, E21.421, E21.377, 170, 452, 257/456, 496, 586, 600, 618, 623, 407
See application file for complete search history.

(56) References Cited

U.S. PATENT DOCUMENTS

| | | | | |
|---|---|---|---|---|
| 4,683,637 A | * | 8/1987 | Varker et al. | 438/294 |
| 5,001,526 A | * | 3/1991 | Gotou | 257/302 |
| 5,541,130 A | * | 7/1996 | Ogura et al. | 438/257 |
| 5,641,983 A | * | 6/1997 | Kato et al. | 257/412 |
| 5,796,143 A | * | 8/1998 | Fulford et al. | 257/330 |
| 6,448,112 B2 | * | 9/2002 | Lee | 438/128 |
| 6,518,112 B2 | | 2/2003 | Armacost et al. | |
| 6,525,403 B2 | * | 2/2003 | Inaba et al. | 257/618 |
| 6,600,200 B1 | * | 7/2003 | Lustig et al. | 257/371 |
| 6,664,601 B1 | * | 12/2003 | King | 257/369 |
| 6,822,281 B2 | * | 11/2004 | Voigt et al. | 257/301 |
| 6,902,969 B2 | * | 6/2005 | Adetutu et al. | 438/199 |
| 7,019,342 B2 | | 3/2006 | Hackler, Sr. et al. | |
| 7,166,895 B2 | * | 1/2007 | Saito | 257/347 |
| 7,180,134 B2 | * | 2/2007 | Yang et al. | 257/347 |
| 7,297,600 B2 | * | 11/2007 | Oh et al. | 438/283 |
| 7,432,160 B2 | * | 10/2008 | Cho et al. | 438/268 |
| 2003/0161192 A1 | * | 8/2003 | Kobayashi et al. | 365/200 |
| 2004/0185626 A1 | * | 9/2004 | Yang | 438/283 |
| 2004/0232471 A1 | * | 11/2004 | Shukuri | 257/314 |
| 2005/0035391 A1 | * | 2/2005 | Lee et al. | 257/308 |
| 2005/0035415 A1 | * | 2/2005 | Yeo et al. | 257/401 |
| 2005/0167750 A1 | * | 8/2005 | Yang et al. | 257/347 |
| 2005/0173768 A1 | * | 8/2005 | Lee et al. | 257/401 |
| 2005/0218434 A1 | * | 10/2005 | Seo et al. | 257/288 |
| 2005/0224800 A1 | * | 10/2005 | Lindert et al. | 257/66 |

(Continued)

Primary Examiner — Teresa M Arroyo
(74) Attorney, Agent, or Firm — Gibb & Riley, LLC; Richard M. Kotulak, Esq.

(57) ABSTRACT

The embodiments of the invention provide a structure and method for a rad-hard FinFET or mesa. More specifically, a semiconductor structure is provided having at least one fin or mesa comprising a channel region on an isolation region. A doped substrate region is also provided below the fin, wherein the doped substrate region has a first polarity opposite a second polarity of the channel region. The isolation region contacts the doped substrate region. The structure further includes a gate electrode covering the channel region and at least a portion of the isolation region. The gate electrode comprises a lower portion below the channel region of the fin, wherein the lower portion of the gate electrode comprises a height that is at least one-half of a thickness of the fin.

14 Claims, 9 Drawing Sheets

(56) References Cited

U.S. PATENT DOCUMENTS

| | | | |
|---|---|---|---|
| 2005/0227424 A1* | 10/2005 | Oh et al. | 438/197 |
| 2005/0266628 A1* | 12/2005 | Wang et al. | 438/197 |
| 2005/0285153 A1* | 12/2005 | Weis et al. | 257/232 |
| 2006/0056228 A1* | 3/2006 | Schloesser et al. | 365/149 |
| 2006/0110884 A1* | 5/2006 | Wang et al. | 438/270 |
| 2006/0231907 A1* | 10/2006 | Kim et al. | 257/401 |
| 2007/0102763 A1* | 5/2007 | Yeo et al. | 257/353 |
| 2007/0134878 A1* | 6/2007 | Brask et al. | 438/294 |
| 2007/0194373 A1* | 8/2007 | Anderson et al. | 257/330 |
| 2007/0249174 A1* | 10/2007 | Yang | 438/712 |
| 2008/0006852 A1* | 1/2008 | Beintner et al. | 257/255 |
| 2008/0149984 A1* | 6/2008 | Chang et al. | 257/314 |
| 2008/0157225 A1* | 7/2008 | Datta et al. | 257/401 |
| 2008/0303095 A1* | 12/2008 | Xiong et al. | 257/365 |
| 2009/0032859 A1* | 2/2009 | Zhu | 257/316 |
| 2010/0038679 A1* | 2/2010 | Chan et al. | 257/190 |
| 2010/0109057 A1* | 5/2010 | Kang et al. | 257/288 |

* cited by examiner

RADIATION HARDENED FINFET

BACKGROUND

1. Field of the Invention

The embodiments of the invention provide a structure and method for a radiation hardened FinFET.

2. Description of the Related Art

Fin-type field effect transistors (FinFETs) are intrinsically relatively immune to various ionizing radiation-induced degradation effects. Further improvements to the basic FinFET structure are desired to further enhance the radiation hardened (rad-hard) qualities of FinFETs. Specifically, weak areas include the cap oxide on top of the fin, the buried oxide below the fin, and the gate edges.

Radiation exposure of isolation regions in complementary metal oxide semiconductor (CMOS) technology can lead to the development of parasitic leakage. This is because the lightly doped regions of silicon can become inverted from charge that is formed in the adjacent thick oxide regions. In shallow-trench isolation (STI), the upper parts of the trench sidewalls adjacent to silicon channels provide exposed regions that are susceptible to radiation damage.

SUMMARY

Accordingly, the embodiments of the invention provide a structure and method for a rad-hard FinFET. More specifically, a semiconductor structure is provided having at least one active area comprising a channel region on an isolation region. An active area has a physical width and a doping concentration. When the width is narrow compared to the height of the active area, it is usually referred to as a fin. When the width of the active area is large compared to its thickness, it is usually referred to as a mesa. Thus, the active area could be a fin or a mesa. In all cases the details of structure, such as the doping of the channel region, the work-function of the gate electrode, etc., result in a zone that extends from the channel surface to some depth below the surface, which is depleted of mobile majority carriers. The extent of this zone is referred to as the channel depletion depth. Furthermore, in the case of fully depleted structures, such as typical FinFET structures, the channel depletion depth is equal to the fin width. A doped substrate region is also provided below the active area, wherein the doped substrate region has a first polarity which may be the same or of opposite a second polarity of the channel region. The isolation region doping will be of greater concentration than that of the channel region, and contacts the doped substrate region. The structure further includes a gate electrode covering the channel region and at least a portion of the isolation region. The gate electrode comprises a lower portion below the channel region of the active area, wherein the lower portion of the gate electrode comprises a height that is typically at least one-half of the channel depletion depth.

The structure further includes a gate dielectric on a top surface of the channel region, at least one sidewall of the channel region, and a portion of at least one sidewall of the isolation region. A gate isolation dielectric is also provided below the gate dielectric, wherein the gate isolation dielectric covers a portion of at least one sidewall of the isolation region. Additionally, an active area isolation dielectric is between the channel region and the isolation region. The gate electrode is on (covers) at least a portion of the active area isolation dielectric. The structure can also include a back-gate electrode between a first active area and a second active area, wherein the back-gate electrode contacts the doped substrate region.

Another semiconductor structure is also provided having at least one fin comprising a lower doped region and an upper channel region, wherein the lower doped region is adjacent to at least one shallow isolation trench region. A dielectric is also provided on at least one sidewall of the fin, wherein lower portions of the dielectric are on (cover) at least a portion of the lower doped region. The structure further includes a gate electrode on the fin and the dielectric, wherein lower portions of the gate electrode are on (cover) the lower portions of the dielectric and the upper channel region. The gate electrode contacts at least one shallow isolation trench region.

The embodiments of the invention also include a method of forming a semiconductor structure comprising forming a doped substrate region, wherein the doped substrate region comprises a first polarity. The method then forms at least one active area over the doped substrate region, such that the active area comprises a channel region having a second polarity which can be either the same or opposite said first polarity on an isolation region, and such that the isolation region contacts the doped substrate region. The forming of the active area forms a fin or a mesa. Following this, a gate electrode is formed covering the channel region and at least a portion of the isolation region. The forming of the gate electrode comprises forming the gate electrode such that the gate electrode comprises a lower portion below the channel region of the active area, and such that the lower portion of the gate electrode comprises a height that is at least one-half of a thickness of the active area.

Prior to the forming of the gate electrode, a gate dielectric is formed on a top surface of the channel region, on at least one sidewall of the channel region, and on a portion of at least one sidewall of the isolation region. Also prior to the forming of the gate electrode and during the forming of the gate dielectric, a gate isolation dielectric is formed such that the gate isolation dielectric is below the gate dielectric, and such that the gate isolation dielectric is on a portion of at least one sidewall of the isolation region.

Furthermore, the method forms an active area isolation dielectric between the channel region and the isolation region. Thus, the forming of the gate electrode forms the gate electrode such that it covers at least a portion of the active area isolation dielectric. Additionally, prior to the forming of the gate electrode, a back-gate electrode is formed between a first active area and a second active area, such that the back-gate electrode contacts the doped substrate region.

Another method of forming semiconductor structure forms at least one active area comprising a lower doped region and an upper channel region. This includes forming the lower doped region such that the lower doped region is adjacent to at least one shallow isolation trench region. This also includes forming one a fin or a mesa. Following this, a dielectric is formed on at least one sidewall of the active area, such that lower portions of the dielectric cover at least a portion of the lower doped region. The method also forms a gate electrode on the active area and the dielectric, such that lower portions of the gate electrode cover the lower portions of the dielectric and the upper channel region. This involves forming the gate electrode such that the gate electrode contacts the shallow isolation trench region.

Accordingly, features are introduced to FinFET technology to suppress degradation caused by exposure to various forms of ionizing radiation. In particular, regions that can accumulate charge and affect the channel potential are minimized by design. Furthermore, three elements which result in suppression of radiation-induced degradation are provided. First, a highly doped lower portion of the silicon sidewall adjacent to the STI is provided. Second, a sidewall dielectric region which overlaps at least a portion of the highly doped lower portion of the silicon sidewall is shown. Next, a continuation of the gate electrode from the top of the STI region downward sufficiently to overlap at least a portion of the sidewall dielectric region and at least a portion of the highly doped lower portion of the silicon sidewall is provided. This structure, applicable to both n-type FETs (nFETs) and p-type FETs (pFETs), eliminates any thick oxide regions adjacent to lightly doped channel regions, hence augmenting resistance to radiation-induced degradation.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
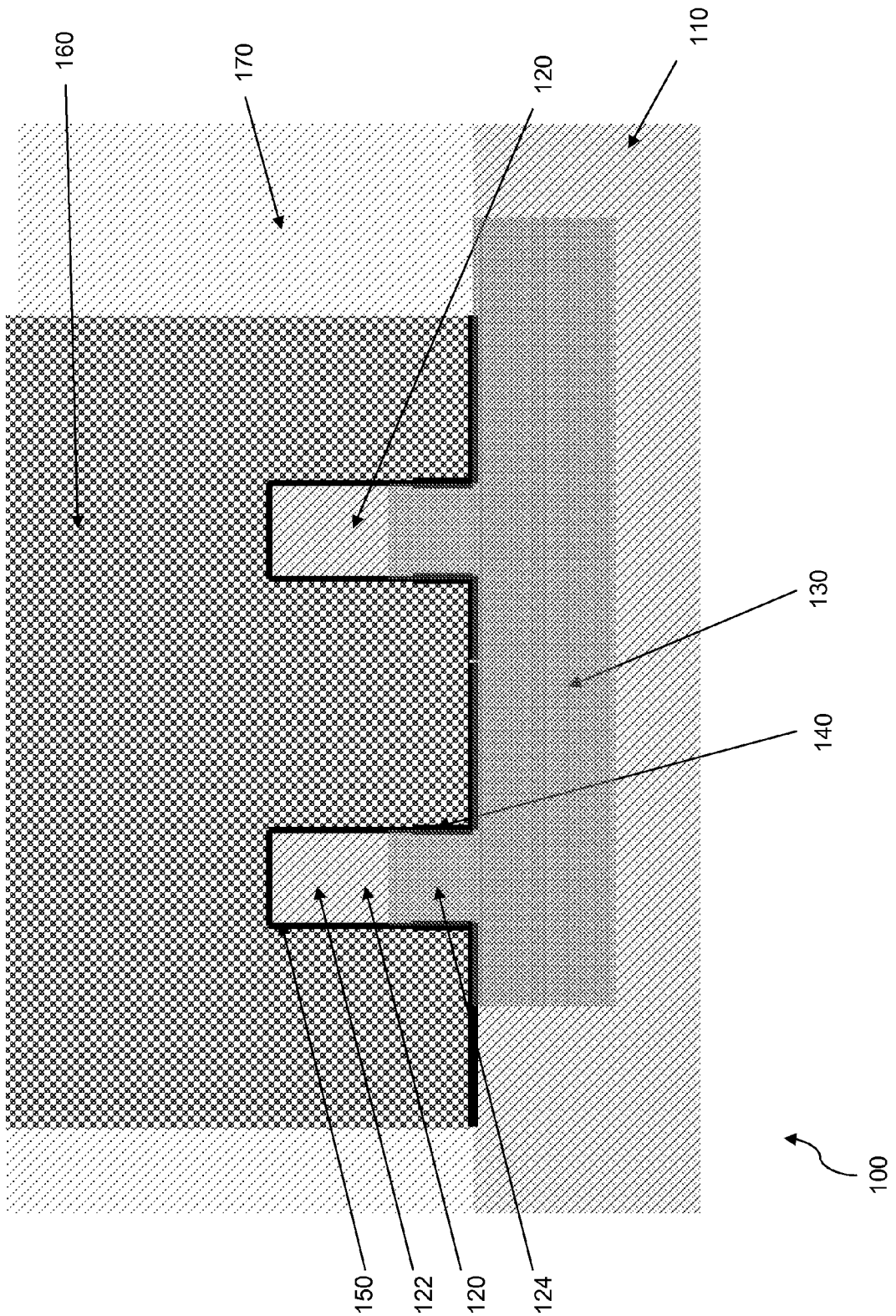
FIG. 1 is a diagram illustrating a FinFET/Tri-gate structure on a bulk substrate.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Features are introduced to FinFET technology to suppress degradation caused by exposure to various forms of ionizing radiation. In particular, regions that can accumulate charge and affect the channel potential or allow the formation of a parasitic channel along isolation regions are minimized by design. Furthermore, three elements which result in suppression of radiation-induced degradation are provided. First, a highly doped lower portion of the silicon sidewall adjacent to the STI is provided. Second, a sidewall dielectric region which overlaps at least a portion of the highly doped lower portion of the silicon sidewall is shown. Next, a continuation of the gate electrode from the top of the STI region downward sufficiently to overlap at least a portion of the sidewall dielectric region and at least a portion of the highly doped lower portion of the silicon sidewall is provided. This structure, applicable to both nFET and pFET, eliminates any thick oxide regions adjacent to lightly doped channel regions, hence augmenting resistance to radiation-induced degradation.

Referring now to FIG. 1, a FinFET/Tri-gate structure 100 on a bulk substrate 110 is illustrated. More specifically, fins 120 are on the substrate 110, wherein the structure 100 has a heavily doped region 130 (i.e., a well region) in an upper portion of the substrate 110 and in a lower portion of the fins 120. The fins 120 each comprise a channel region 122 on an isolation region 124, wherein the isolation region comprises an upper portion of the heavily doped region 130. The structure 100 further includes a gate isolation dielectric 140 and a gate dielectric 150, wherein the gate isolation dielectric 140 is on portions of a top surface of the substrate 110 and on lower sidewalls of the fins 120. The gate isolation dielectric 140 and the gate dielectric 150 can comprise the same, continuous, unbroken insulator layer. The gate dielectric 150 contacts the gate isolation dielectric 140, wherein the gate dielectric 150 is on middle and upper sidewalls of the fins 120 and on top surfaces of the fins 120. Thus, the gate dielectric 150 covers the channel region 122 and an upper portion of the isolation region 124. Moreover, a boundary between the gate dielectric 150 and the gate isolation dielectric 140 is below a boundary between the channel region 122 and the isolation region 124 (with respect to the substrate).

Additionally, a gate electrode 160 is provided over the fins 120. Specifically, the gate electrode 160 is on the gate dielectric 150 and the gate isolation dielectric 140. Thus, the gate electrode 160 is adjacent to the isolation regions 124. An isolation oxide 170 is on portions of the top surface of the substrate 110 that are not covered by the gate isolation dielectric 140. Thus, sidewalls of the isolation oxide 170 contact sidewalls of the gate electrode 160.

Figure 2:
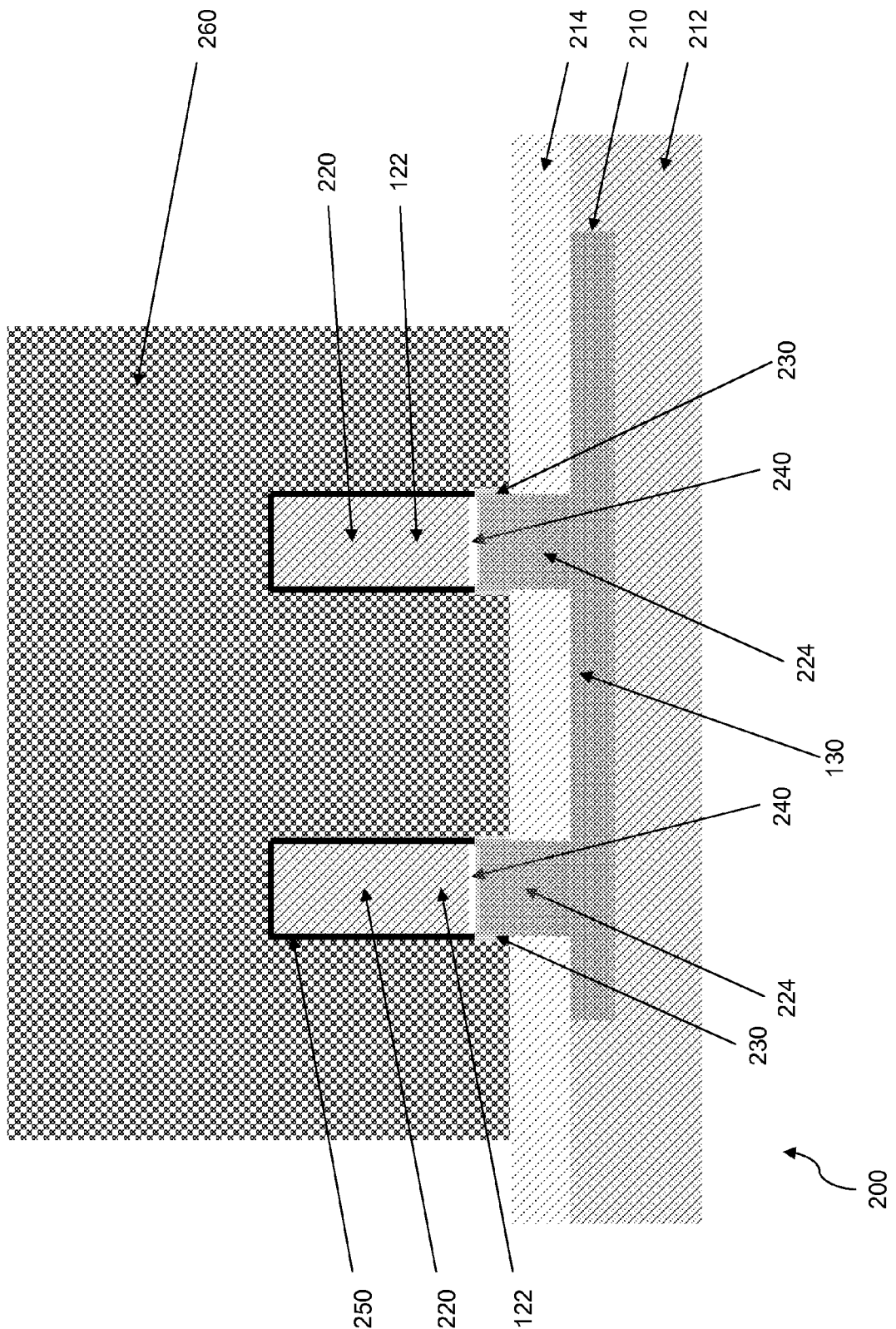
FIG. 2 is a diagram illustrating a FinFET/Tri-gate structure on an SOI.

FIG. 2 illustrates a FinFET/Tri-gate structure 200 on an SOI 210, wherein the SOI 210 comprises an oxide layer 214 on a silicon layer 212. More specifically, fins 220 are on the silicon layer 212, wherein the fins 220 extend upwardly through the oxide layer 214. The fins 220 include upper channel regions 122 and lower doped regions 224 separated by fin isolation dielectrics 240. The lower doped regions 224 comprise a portion of the heavily doped region 130 and are similarly heavily doped.

The structure 200 also includes gate isolation dielectrics 230, fin isolation dielectrics 240, and gate dielectrics 250. The gate isolation dielectrics 230 are on portions of the sidewalls of the fins 220. Specifically, the gate isolation dielectrics 230 are above the oxide layer 214 and below the fin isolation dielectrics 240. The gate isolation dielectrics 230 and the fin isolation dielectrics 240 can comprise the same, continuous, unbroken insulator layer. The fin isolation dielectrics 240 traverse the width of the fins 220, such that the fin isolation dielectrics 240 separate lower portions of the fins 220 (the lower doped regions 224) from middle and upper portions of the fins 220 (the channel regions 122). As such, the fin isolation dielectrics 240 are adjacent first sidewalls of the fins 220, continue through the body of the fins 220, and are adjacent second sidewalls of the fins 220, wherein the first sidewalls are opposite the second sidewalls.

The gate dielectrics 250 are on middle and upper sidewalls of the fins 220 and on top surfaces of the fins 220. The gate dielectrics 250 contact the fin isolation dielectrics 240 and the gate isolation dielectrics 230. Thus, the middle and upper sidewalls of the fins 220 are covered by the gate dielectrics 250 and portions of the lower sidewalls of the fins are covered by the gate isolation dielectrics 230. A gate electrode 260 is also provided over the SOI 210 and the fins 220. Specifically, the gate electrode 260 is on the gate dielectrics 250, the gate isolation dielectrics 230, and portions of the oxide layer 214.

Figure 3:
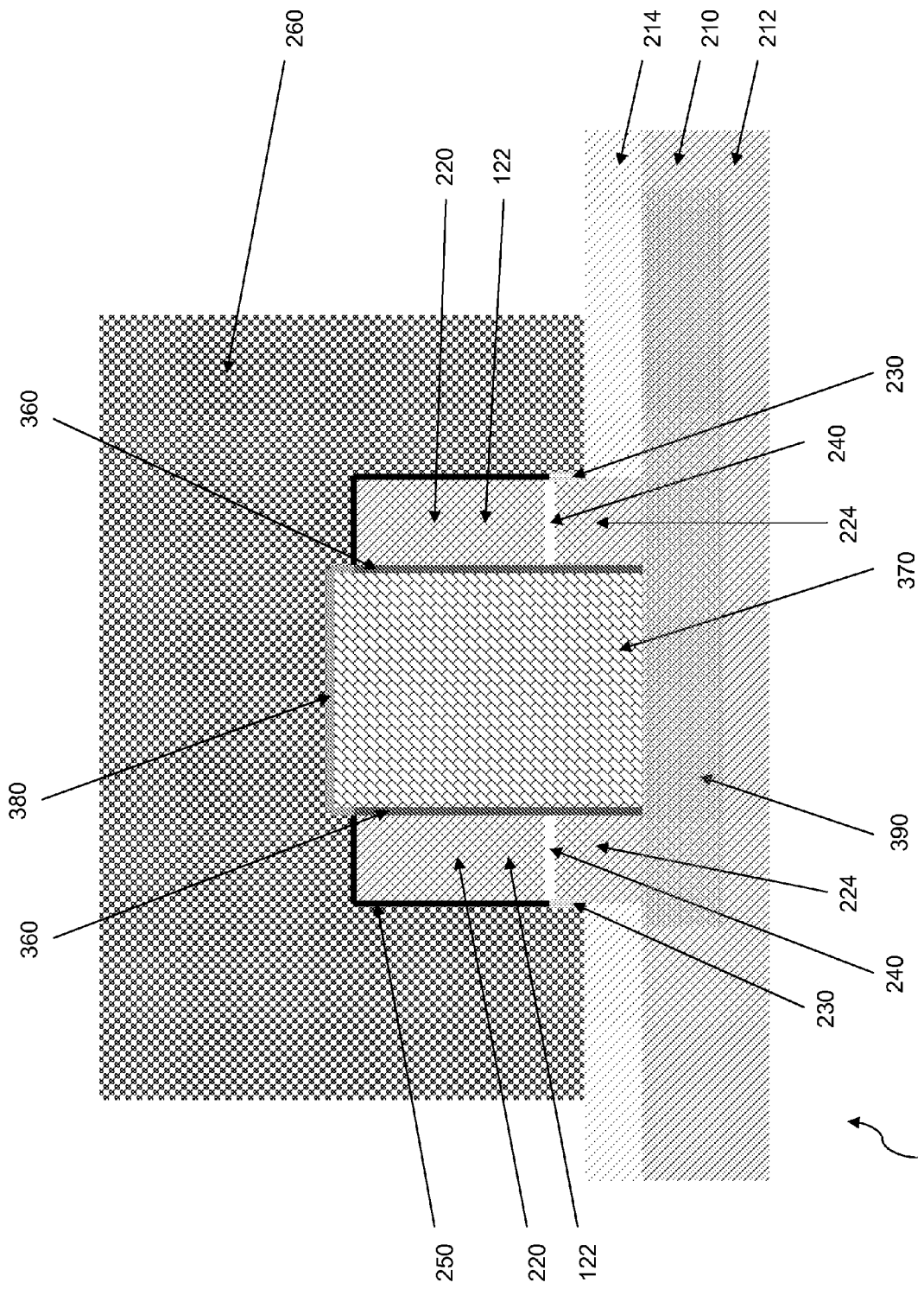
FIG. 3 is a diagram illustrating a back-gated FinFET/Tri-gate structure on an SOI.

Referring now to FIG. 3, a back-gated FinFET/Tri-gate structure 300 fabricated on an SOI wafer is illustrated, wherein the structure 300 comprises the silicon substrate layer 212, an oxide layer 214, the fins 220, fabricated from the upper silicon layer of the SOI wafer, the fin isolation dielectrics 240 formed from the SOI buried insulator, and the gate electrode 260. The structure 300 also includes the gate isolation dielectrics 230 and the gate dielectrics 250. However, unlike the structure 200, the fins 220 of the structure 300 do not have the gate isolation dielectrics 230 and the gate dielectrics 250 on inner sidewalls thereof. Rather, as illustrated in FIG. 3, the fins 220 have back-gate dielectrics 360 on inner sidewalls thereof, wherein the inner sidewalls of the fins 220 are between the fins 220. Bottom surfaces of the back-gate dielectrics 360 contact the silicon layer 212 and top portions of the back-gate dielectrics 360 contact the gate dielectrics 250. The back-gate dielectrics 360 also contact the fin isolation dielectrics 240.

Further, the structure 300 includes a back-gate electrode 370 between the back-gate dielectrics 360. More specifically, sidewalls of the back-gate electrode 370 contact the back-gate dielectrics 360; and, a top surface of the back-gate electrode 370 is above top surfaces of the fins 220. A bottom surface of the back-gate electrode 370 contacts the silicon layer 212, wherein the structure 300 does not include the buried insulator 240 or the oxide layer 214 between the inner sidewalls of the fins 220.

Additionally, an inter-gate-electrode dielectric 380 is on the top surface and upper sidewalls of the back-gate electrode 370. The inter-gate-electrode dielectric 380 contacts the back-gate dielectrics 360 and the gate dielectrics 250. Furthermore, a heavily doped region 390 is included in the SOI 210. Specifically, the heavily doped region 390 is in an upper portion of the silicon layer 212 and beneath the oxide layer 214, the fins 220, and the back-gate electrode 370.

Figure 4:
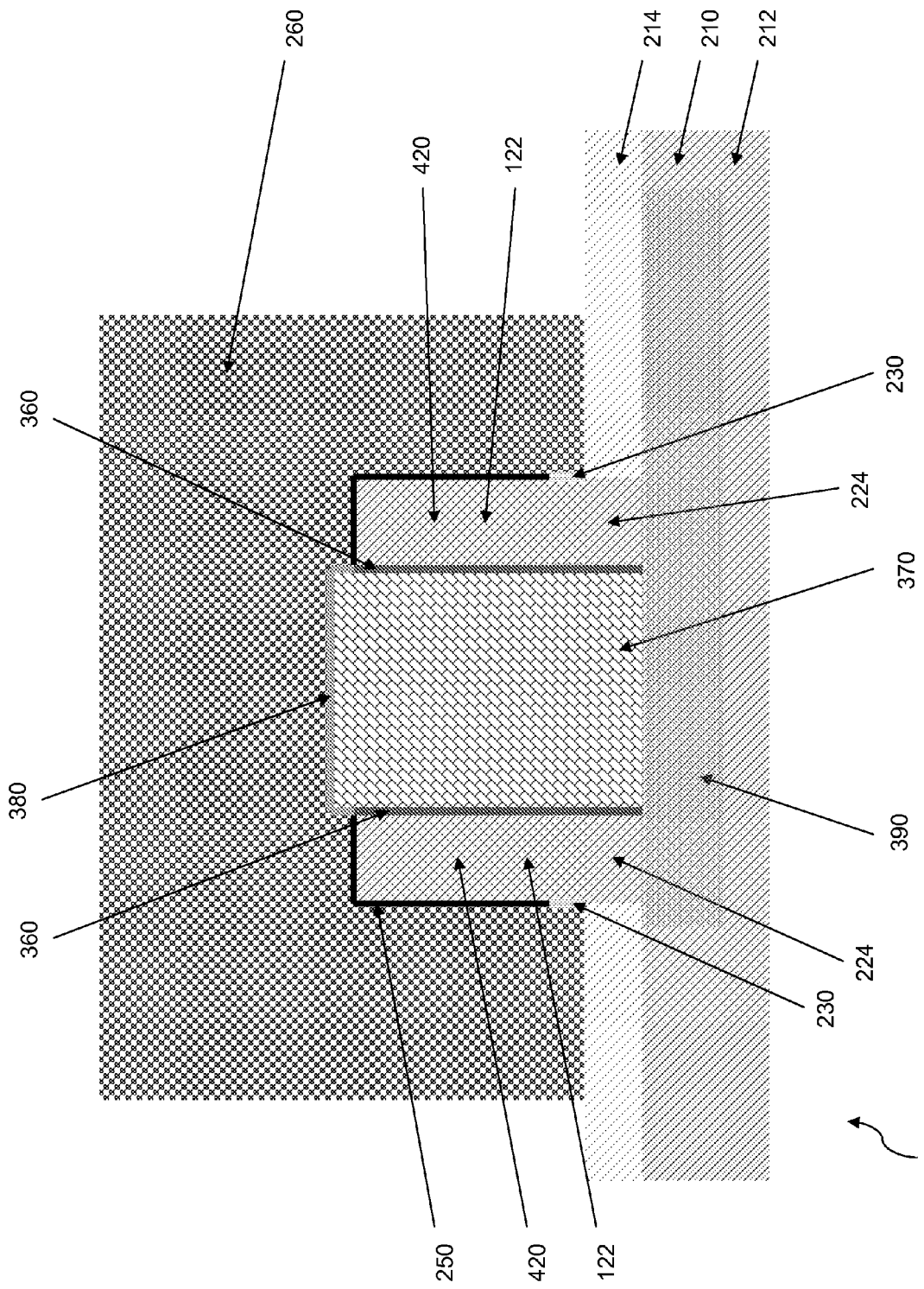
FIG. 4 is a diagram illustrating a back-gated FinFET/Tri-gate structure on a bulk substrate.

Referring to FIG. 4, a back-gated FinFET/Tri-gate structure 400 having fins 420 on a bulk substrate is illustrated. The structure 400 has primarily the same components as the structure 300; however, the structure 400 does not include the fin isolation dielectrics 240. By design, the thickness of the fin taken together with the doping concentration in the fins results in a fin which is fully depleted of mobile carriers (holes and electrons) and hence the channels 222 in the fins are electrically isolated from the back-gate electrode 370.

The embodiments herein further provide a process of forming the structure 100. Many of the details of forming fins, isolation regions, channel regions, dielectrics, gate electrodes, etc., are well-known and are not discussed herein in detail so as to focus the reader on the salient portions of the invention. Instead, reference is made to U.S. Patent Publications 20060043616 to Anderson et al. for the description of such details and the same are fully incorporated herein by reference. The following processes are only examples and the invention is not limited to the times, temperatures, materials, concentrations set forth below and instead can be formed using any similar processing.

The process begins with a bulk starting wafer with a silicon germanium (SiGe) layer having approximately 20-40% germanium. The SiGe layer is buried below a top pure silicon (Si) region. Heavily doped regions 130 are formed by high-energy ion implantation. The energy is chosen so that the range of the ions implanted falls inside region 130. A second high-energy implantation can additionally be used to dope the isolation regions 224, employing a somewhat lower energy than that used to dope region 130.

Next, a silicon dioxide/silicon nitride ($SiO_2/Si_3N_4$) cap layer is formed, wherein the cap layer is patterned to form a fin pattern. The silicon is etched using the cap layer as a mask to form the fins 120, wherein the etch is stopped in the SiGe layer. The cap layer is subsequently stripped from the tops of the fins 120. Following this, a 600-degree Celsius oxidation process is performed on exposed regions of SiGe; and, thin oxide is grown in the pure Si regions. The gate dielectrics 140 and 150 are then formed on surfaces of the fins 120; and, gate electrode material is formed and planarized. Finally, the gate electrodes 160 are patterned and etched; and, source and drain regions of exposed fins 120 are doped.

In the embodiment shown in FIG. 2, the starting wafer comprises a Silicon On Insulator (SOI) wafer. The buried insulator of the SOI wafer is used to form the fin isolation dielectric 240, and the top silicon of the SOI wafer is used to form the fins 220, in subsequent steps. Optionally, heavily doped regions 210 are formed by high-energy ion implantation. The energy is chosen so that the range of the ions implanted falls inside region 210. A second high-energy implantation can additionally be used to dope the isolation regions 224, employing a somewhat lower energy than that used to dope the lower, doped regions 224.

Next, a silicon dioxide/silicon nitride ($SiO_2/Si_3N_4$) cap layer is formed, wherein the cap layer is patterned to form a fin pattern. The silicon is etched using the cap layer as a mask to form the fins 220, wherein the etch proceeds beyond the buried oxide 240 and stops at a depth below the buried insulator that is typically between one and three times the fin thickness. Insulation region 214 is formed by a silicon ion implant into the exposed SOI wafer regions followed by an oxidation. The cap layer is subsequently stripped from the tops of the fins 120. The gate dielectric 250 and the fin isolation dielectric 240 are then formed on surfaces of the fins 220, and lower, doped regions 224, respectively; gate electrode material is formed and planarized. Finally, the gate electrodes 260 are patterned and etched; and, source and drain regions of exposed fins 220 are doped.

The embodiment of FIG. 3 can be fabricated along the same lines as outlined for FIG. 2, with the following deviations. After formation of the silicon dioxide insulator 214, a mask is formed with an opening to allow the etch of the silicon dioxide insulator 214 between the two fins 220. Dielectric 360 is formed on the exposed sides of the fins and the exposed surface of the substrate 212 between fins 220. A direction etch is used to remove the dielectric from the substrate 212. The back-gate electrode 370 is formed by either in-situ-doped selective silicon growth or by non-selective deposition and etch-back/planarization. Next the mask is removed and the gate dielectric 250, dielectric 230, and inter-gate dielectric 380 are formed by oxidation and/or deposition processes. Gate electrode material is deposited, planarized, and patterned to form gate electrode 260.

A process of forming the structure 400 is also provided. Many of the details of forming back-gate regions, well regions, fins, dielectrics, gate electrodes, etc., are well-known and are not discussed herein in detail so as to focus the reader on the salient portions of the invention. Instead, reference is made to U.S. Patent Publications 20050245009 to Bryant et al. for the description of such details and the same are fully incorporated herein by reference.

The process begins with a bulk starting wafer with a silicon germanium (SiGe) layer having approximately 20-40% germanium. The SiGe layer is buried below a top pure silicon (Si) region. Next, a silicon dioxide/silicon nitride ($SiO_2/Si_3N_4$) cap layer is formed, wherein trenches are etched down to the SiGe layer (signal layer for the etch stop). The back-gate dielectrics 360 are formed on surfaces and a thin layer of back-gate material is deposited. An anisotropic etch is then performed to form spacers on the trench sidewalls. Following this, exposed back-gate dielectrics 360 at the bottom of the trench are removed and the trenches are filled with back-gate electrode material. The back-gate material is planarized, wherein the polysilicon top of the back-gate material is subsequently oxidized (reacted). Next, the back-gate material is etched back until tops of the $SiO_2/Si_3N_4$ cap layer are exposed. The process then selectively etches the cap layer, wherein some loss of the reacted material on top of the back-gate may occur. Further, spacers ($SiO_2$, $Si_3N_4$, or composite) are formed on exposed edges of the back-gate material. The silicon is anisotropically etched to form the fins 220 surrounding the back-gate region. Following this, the spacers over the fins 220 are removed and the gate dielectrics 250 are formed on exposed surfaces of the fins 220 (including tops of the fins 220). Front gate electrode material is also formed and planarized. The process then patterns and etches front and back gate electrodes and dopes source and drain regions of exposed fins 220. Processes for forming structures on SOI (e.g., the structures 200 and 300) are similar to the processes for forming structures on the bulk substrate (e.g., the structures 100 and 400).

Figure 5:
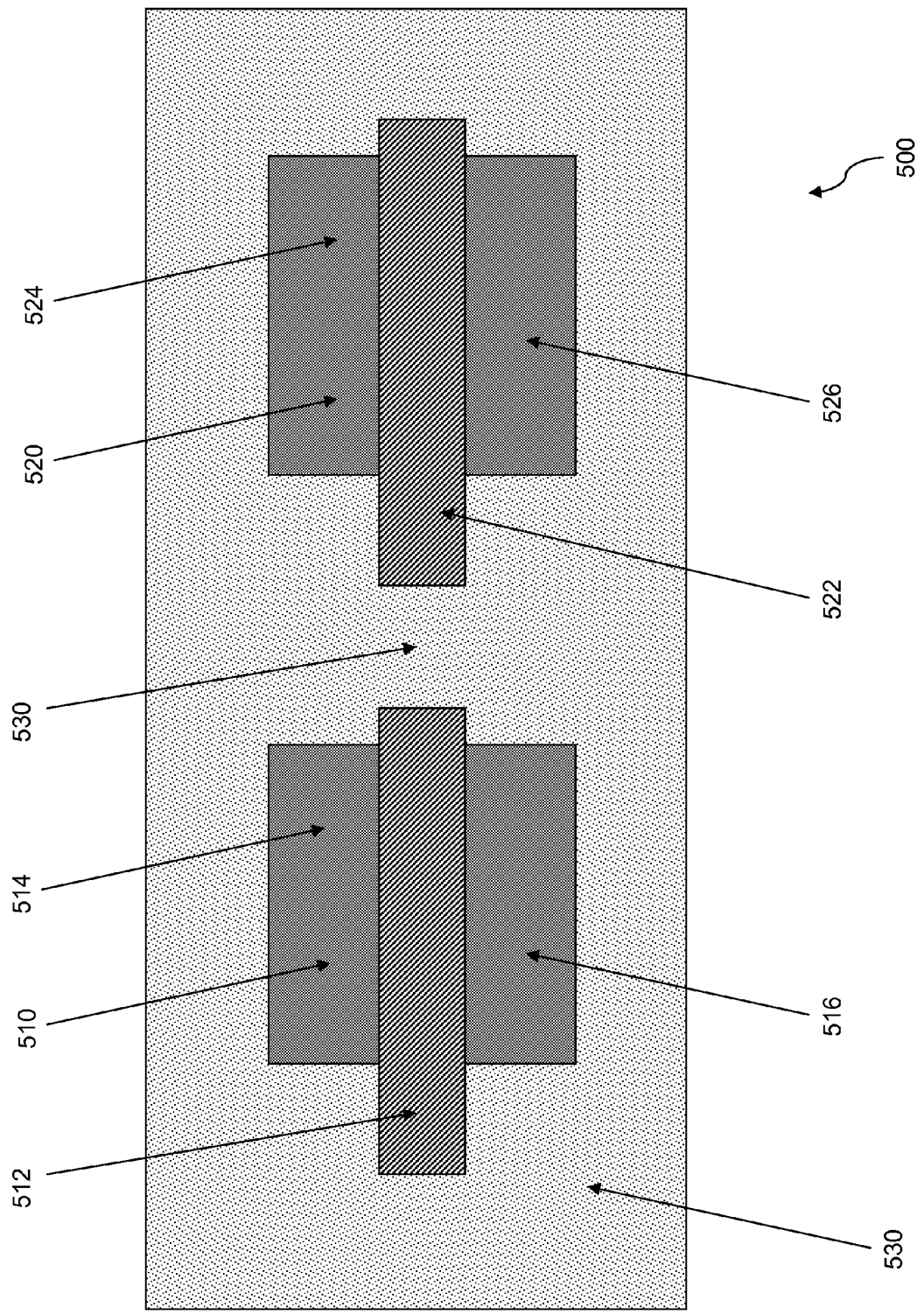
FIG. 5 is a diagram illustrating a top view of a CMOS structure.

Referring now to FIG. 5, a top view of a rad-hard CMOS structure 500 is illustrated, wherein at least one nFET 510 and at least one pFET 520 are on an isolation region 530. More specifically, the nFET 510 includes a gate 512, a source region 514, and a drain region 516. Similarly, the pFET 520 includes a gate 522, a source region 524, and a drain region 526. An STI region 530 is between the nFET 510 and the pFET 520.

Figure 6:
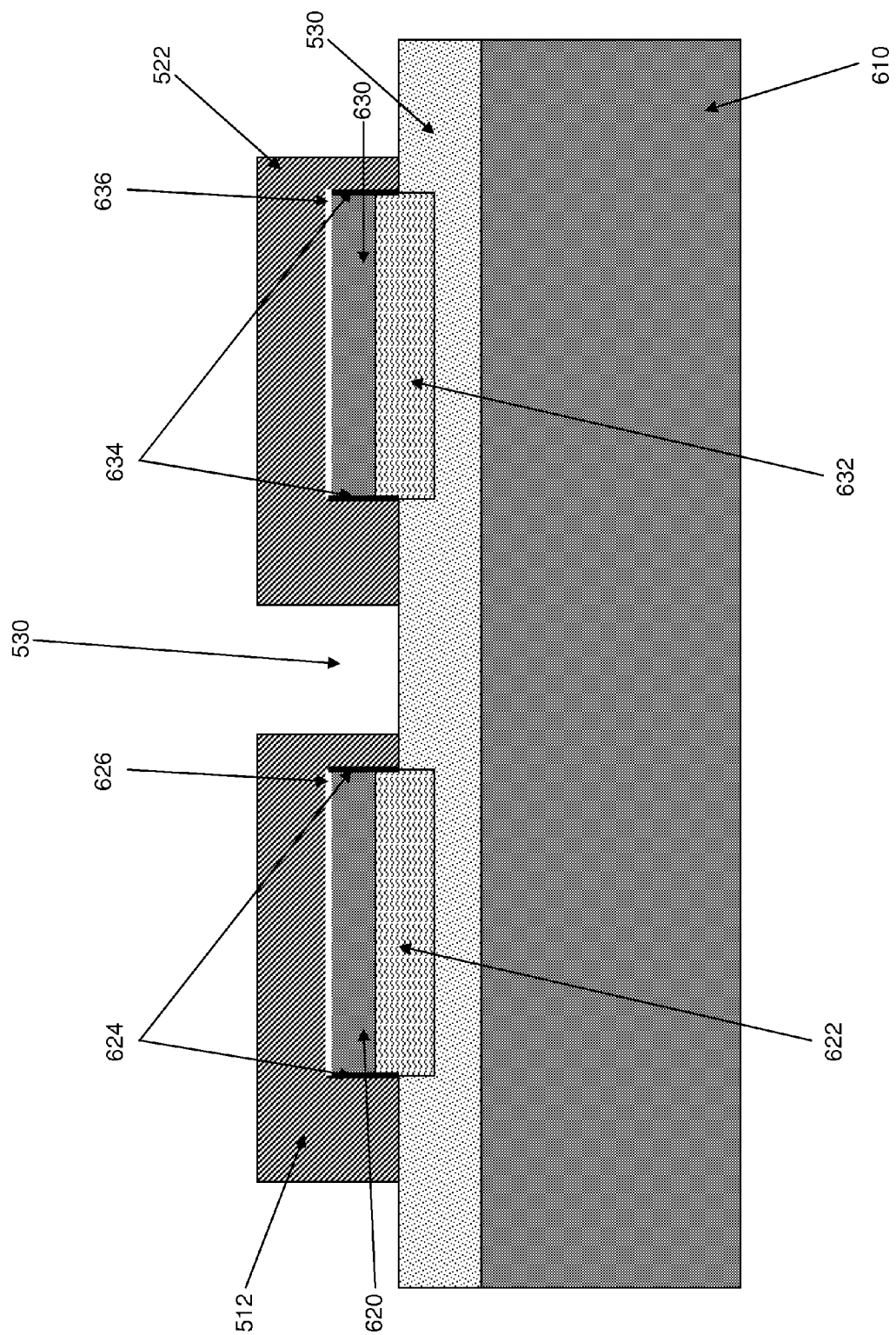
FIG. 6 is a diagram illustrating a cross-sectional view of the CMOS structure illustrated in FIG. 5 on an SOI.

FIG. 6 illustrates a cross-sectional view of the CMOS structure 500 on an SOI 610, wherein the nFET 510 and the pFET 520 include mesas 620 and 630, respectively. Lower portions of the mesas 620 and 630 include a heavily p-doped region 622 and a heavily n-doped region 632, respectively. The mesas 620 and 630 also have sidewall dielectrics 624 and 634, respectively, thereon. Specifically, the sidewall dielectrics 624 and 634 are on upper sidewalls of the mesas 620 and 630, respectively, and on at least a portion of lower sidewalls of the mesas 620 and 630, respectively. Thus, the sidewall dielectrics 624 and 634 are adjacent (next to, proximate, cover, on, contact, etc.) at least a portion of the heavily p-doped region 622 and the heavily n-doped region 632, respectively. As illustrated in FIG. 6, the sidewall dielectrics 624 and 634 are adjacent an upper portion of the heavily p-doped region 622 and the heavily n-doped region 632, respectively. In other words, the sidewall dielectrics 624, 634 overlap a border between the heavily doped regions 622, 632 and the remaining upper portions of the mesas 620, 630 (upper channel regions).

The mesas 620 and 630 also have gate dielectrics 626 and 636 on respective top surfaces thereof. The gates 512 and 522 are on the sidewall dielectrics 624 and 634, respectively, and on the gate dielectrics 626 and 636, respectively. Thus, the gates 512 and 522 are adjacent (proximate, cover, etc.) at least a portion of the heavily p-doped region 622 and the heavily n-doped region 632, respectively. As illustrated in FIG. 6, the gates 512 and 522 are adjacent an upper portion of the heavily p-doped region 622 and the heavily n-doped region 632, respectively. In other words, the gates 512, 522 overlap a border between the heavily doped regions 622, 632 and the remaining upper portions of the mesas 620, 630 (upper channel regions). The STI region 530 is between the gates 512 and 522.

Figure 7:
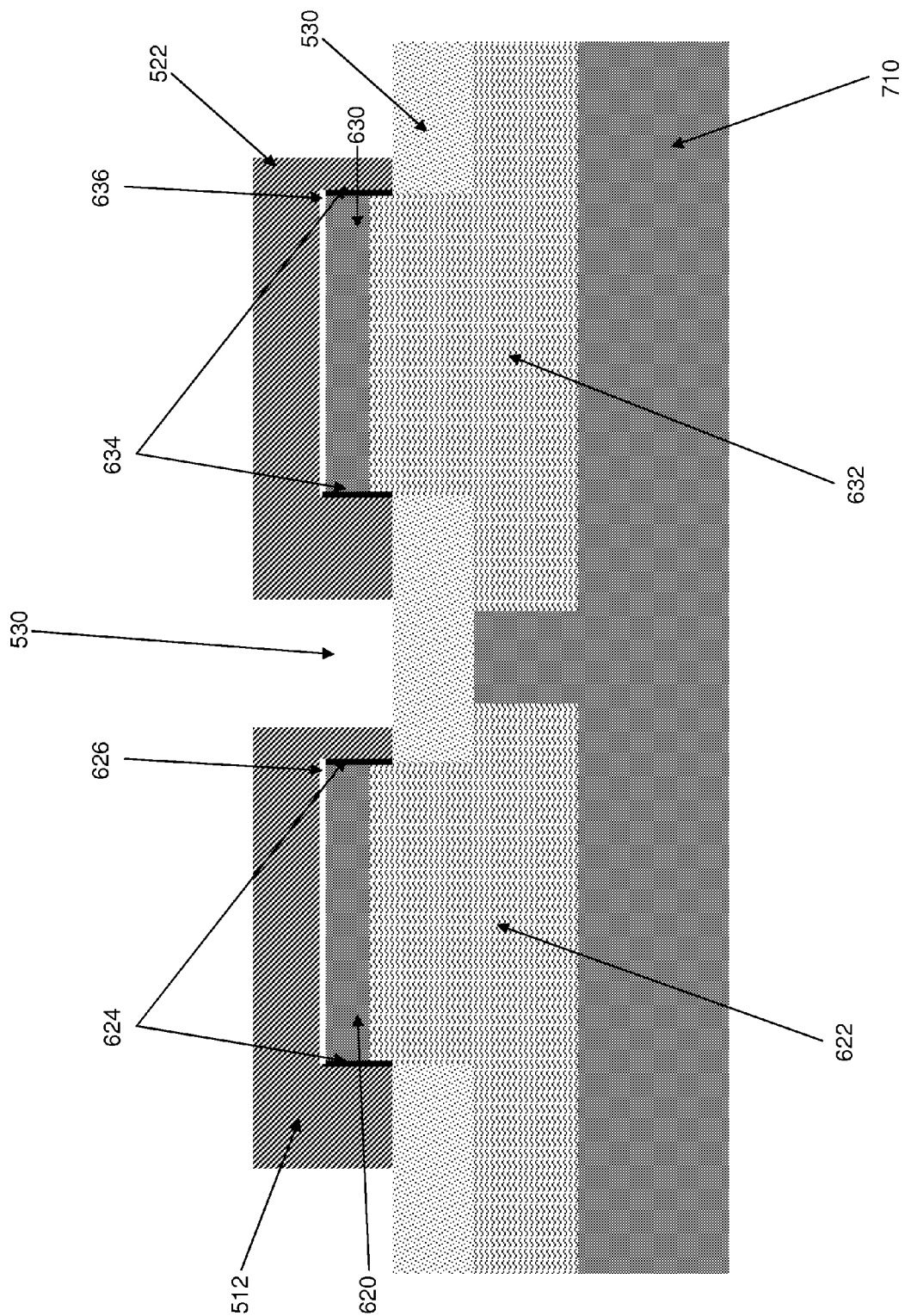
FIG. 7 is a diagram illustrating a cross-sectional view of the CMOS structure illustrated in FIG. 5 on a bulk substrate.

Referring now to FIG. 7 a cross-sectional view of the CMOS structure 500 on a bulk substrate 710 is illustrated. Unlike the structure in FIG. 6, the heavily doped regions 622 and 632 extend downward through the isolation region 530 and into upper portions of the substrate 710. In FIG. 6, the isolation region 530 separates the heavily doped regions 622 and 632 from the substrate 710. As shown in FIG. 7, the heavily doped regions 622 and 632 are inverted T-shaped structures, wherein lower portions of the heavily doped regions 622 and 632 are in the substrate 710, and wherein upper portions of the heavily doped regions 622 and 632 are in the mesas 620 and 630.

A process for forming the CMOS structure 500 (either on the SOI 610 or the bulk substrate 710) is also provided. The STI regions 530 are formed, followed by formation of the heavily doped regions 622 and 632 via high-energy ion implantation. It is recognized that the heavily doped regions 622 and 632 can also be formed prior to the formation of the STI regions 530. Many of the details of forming STI regions, doped regions, mesas, dielectrics, gates, source/drain regions, etc., are well-known and are not discussed herein in detail so as to focus the reader on the salient portions of the invention. Instead, reference is made to U.S. Patent Publications 20060084212 to Anderson et al. for the description of such details and the same are fully incorporated herein by reference.

Next, the trench isolation is recessed (etched back) until at least some of the sidewalls of the heavily doped regions 622 and 632 are exposed. The process then forms the mesas 620 and 630 and the gate dielectrics 626 and 636. Gate electrode material (e.g., polysilicon) is then deposited and can be planarized. The gates 512 and 522 are subsequently patterned, followed by formation of the sidewall dielectrics 624 and 634 thereon. Ion implantation of source/drain extensions and halos is then performed, in addition to formation of spacers (not shown). The process then forms the source regions 514 and 524, and the drain regions 516 and 526, via deep ion implantation. This is performed separately for the nFET 510 and the pFET 520 via masking. Following this, the process performs annealing and silicide formation. Additional dielectrics are then deposited, etched, and vias are filled. Finally, interconnects are formed.

Accordingly, the embodiments of the invention provide a structure and method for a rad-hard FinFET. More specifically, a semiconductor structure is provided having at least one active area comprising a channel region on an isolation region. The active area may comprise a fin or a mesa, according to the embodiment employed. A doped substrate region (also referred to herein as the "heavily doped region") is also provided below the active area, wherein the doped substrate region has a first polarity which may be opposite a second polarity of the channel region or the same polarity of the channel region. The isolation region contacts the doped substrate region.

The structure further includes a gate electrode covering the channel region and at least a portion of the isolation region. Thus, as described above, the gate electrode is adjacent to the isolation region. The gate electrode comprises a lower portion below the channel region of the fin, wherein the lower portion of the gate electrode comprises a height that is at least one-half of a thickness of the fin. As described above, the structure could include an isolation oxide on portions of the top surface of the substrate that are not covered by the gate isolation dielectric. Thus, sidewalls of the isolation oxide contact sidewalls of the gate electrode.

The structure further includes a gate dielectric on a top surface of the channel region, at least one sidewall of the channel region, and a portion of at least one sidewall of the isolation region. A gate isolation dielectric is also provided below the gate dielectric, wherein the gate isolation dielectric covers a portion of at least one sidewall of the isolation region. As described above, a boundary between the gate dielectric and the gate isolation dielectric is below a boundary between the channel region and the isolation region (with respect to the substrate).

Additionally, a fin isolation dielectric is between the channel region and the isolation region. As described above, the gate isolation dielectrics and the fin isolation dielectrics can comprise the same, continuous, unbroken insulator layer. The gate electrode is on (covers) at least a portion of the fin isolation dielectric. As described above, the fin isolation dielectrics traverse the width of the fins; and as such, the fin isolation dielectrics are adjacent first sidewalls of the fins, continue through the body of the fins, and are adjacent second sidewalls of the fins, wherein the first sidewalls are opposite the second sidewalls. The structure can also include a back-gate electrode between a first fin and a second fin, wherein the back-gate electrode contacts the doped substrate region. As described above, sidewalls of the back-gate electrode contact back-gate dielectrics; and, a top surface of the back-gate electrode is above top surfaces of the fins.

Another semiconductor structure is also provided having at least one fin comprising a lower doped region (also referred to herein as the "heavily p-doped region", the "heavily n-doped region", or the "heavily doped regions") and an upper channel region, wherein the lower doped region is adjacent to at least one shallow isolation trench region. As described above, FIG. 5 illustrates a top view of a rad-hard CMOS structure, wherein at least one nFET and at least one pFET are on an isolation region, and wherein an STI region is between the nFET and the pFET. A dielectric (also referred to herein as the "sidewall dielectric") is also provided on at least one sidewall of the fin, wherein lower portions of the dielectric are on (cover) at least a portion of the lower doped region. As described above, the sidewall dielectrics overlap a border between the heavily doped regions and the remaining upper portions of the fins.

The structure further includes a gate electrode (also referred to herein as the "gates") on the fin and the dielectric, wherein lower portions of the gate electrode are on (cover) the lower portions of the dielectric and the upper channel region. As described above, the gates are adjacent (proximate, cover, etc.) at least a portion of the heavily p-doped region and the heavily n-doped region. Moreover, the gates overlap a border between the heavily doped regions and the remaining upper portions of the fins. The gate electrode contacts at least one shallow isolation trench region.

The embodiments of the invention also include a method of forming a semiconductor structure comprising forming a doped substrate region, wherein the doped substrate region comprises a first polarity. The method then forms at least one fin over the doped substrate region, such that the fin comprises a channel region having a second polarity which can be the same or opposite said first polarity on an isolation region, and such that the isolation region contacts the doped substrate region.

Following this, a gate electrode is formed covering the channel region and at least a portion of the isolation region. Thus, as described above, the gate electrode is adjacent to the isolation region. The forming of the gate electrode comprises forming the gate electrode such that the gate electrode comprises a lower portion below the channel region of the fin (i.e., the portions of the gate electrode 160 that are below the channel region 122 of the fin 120), and such that the lower portion of the gate electrode comprises a height that is at least one-half of a thickness of the fin. As described above, the structure could include an isolation oxide on portions of the top surface of the substrate that are not covered by the gate isolation dielectric. Thus, sidewalls of the isolation oxide contact sidewalls of the gate electrode.

Prior to the forming of the gate electrode, a gate dielectric is formed on a top surface of the channel region, on at least one sidewall of the channel region, and on a portion of at least one sidewall of the isolation region. Also prior to the forming of the gate electrode and during the forming of the gate dielectric, a gate isolation dielectric is formed such that the gate isolation dielectric is below the gate dielectric, and such that the gate isolation dielectric is on a portion of at least one sidewall of the isolation region. As described above, a boundary between the gate dielectric and the gate isolation dielectric is below a boundary between the channel region and the isolation region (with respect to the substrate).

Furthermore, the method forms a fin isolation dielectric between the channel region and the isolation region. As described above, the gate isolation dielectrics and the fin isolation dielectrics can comprise the same, continuous, unbroken insulator layer. Thus, the forming of the gate electrode forms the gate electrode such that it covers at least a portion of the fin isolation dielectric. As described above, the fin isolation dielectrics traverse the width of the fins; and as such, the fin isolation dielectrics are adjacent first sidewalls of the fins, continue through the body of the fins, and are adjacent second sidewalls of the fins, wherein the first sidewalls are opposite the second sidewalls.

Additionally, prior to the forming of the gate electrode, a back-gate electrode is formed between a first fin and a second fin, such that the back-gate electrode contacts the doped substrate region. As described above, sidewalls of the back-gate electrode contact back-gate dielectrics; and, a top surface of the back-gate electrode is above top surfaces of the fins.

Another method of forming a semiconductor structure forms at least one fin comprising a lower doped region and an upper channel region. This includes forming the lower doped region such that the lower doped region is adjacent to at least one shallow isolation trench region. As described above, FIG. 5 illustrates a top view of a rad-hard CMOS structure, wherein at least one nFET and at least one pFET are on an isolation region, and wherein an STI region is between the nFET and the pFET.

Following this, a dielectric is formed on at least one sidewall of the fin, such that lower portions of the dielectric cover at least a portion of the lower doped region. As described above, the sidewall dielectrics overlap a border between the heavily doped regions and the remaining upper portions of the fins. The method also forms a gate electrode on the fin and the dielectric, such that lower portions of the gate electrode cover the lower portions of the dielectric and the upper channel region. As described above, the gates are adjacent (proximate, cover, etc.) at least a portion of the heavily p-doped region and the heavily n-doped region. Moreover, the gates overlap a border between the heavily doped regions and the remaining upper portions of the fins. This involves forming the gate electrode such that the gate electrode contacts the shallow isolation trench region.

Figure 8:
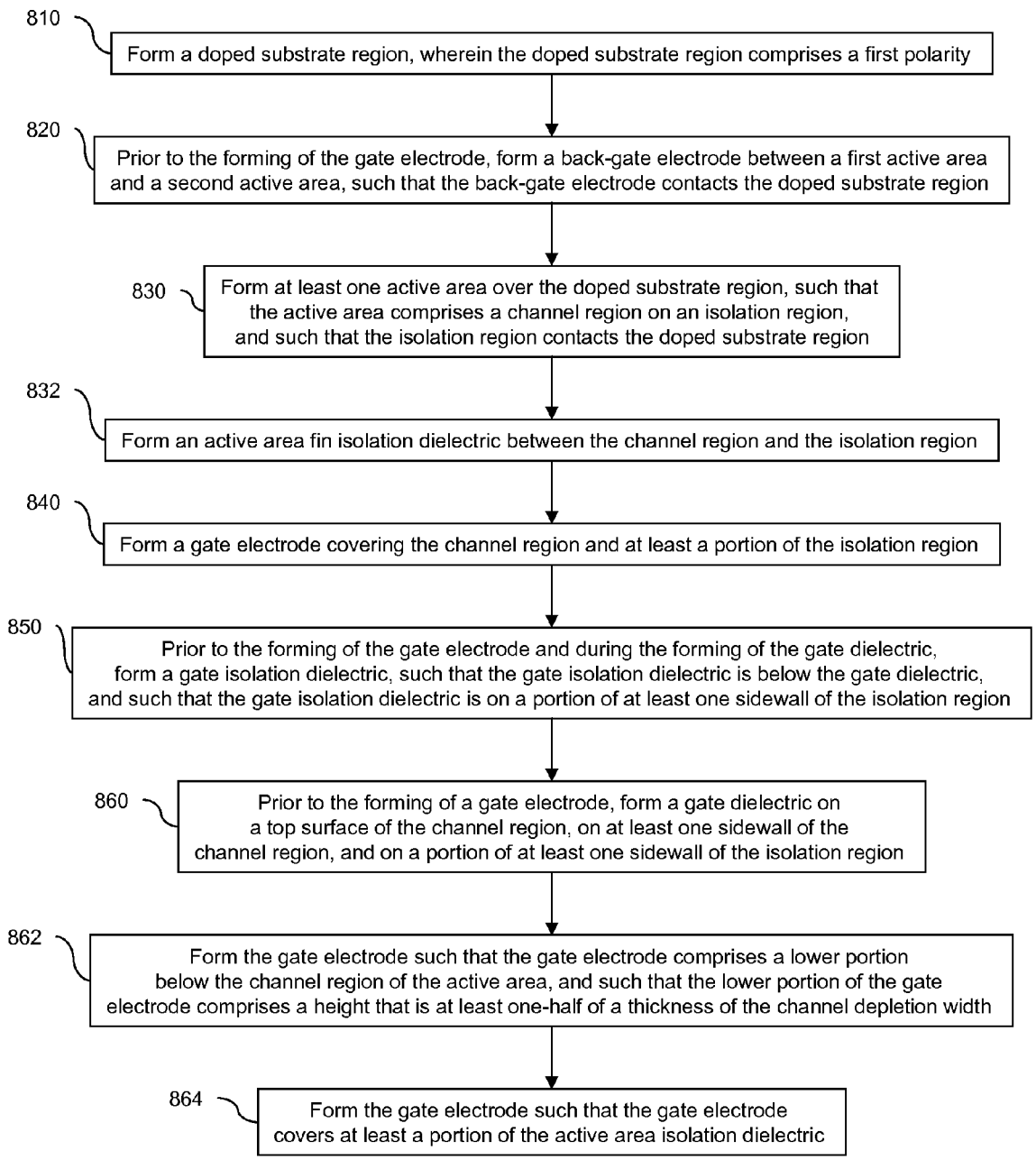
FIG. 8 is a flow diagram illustrating a method of forming a rad-hard FinFET.

FIG. 8 is a flow diagram illustrating a method of forming a rad-hard FinFET. The method begins in item 810 by forming a doped substrate region, wherein the doped substrate region comprises a first polarity. The method, in item 820, then forms at least one fin over the doped substrate region, such that the fin comprises a channel region having a second polarity of the same, or opposite said first polarity on an isolation region, and such that the isolation region contacts the doped substrate region.

Prior to the forming of a gate electrode, in item 830, a gate dielectric is formed on a top surface of the channel region, on at least one sidewall of the channel region, and on a portion of at least one sidewall of the isolation region. Also prior to the forming of the gate electrode and during the forming of the gate dielectric, in item 832, a gate isolation dielectric is formed such that the gate isolation dielectric is below the gate dielectric, and such that the gate isolation dielectric is on a portion of at least one sidewall of the isolation region. As described above, a boundary between the gate dielectric and the gate isolation dielectric is below a boundary between the channel region and the isolation region (with respect to the substrate).

In item 840, the method forms a fin isolation dielectric between the channel region and the isolation region. As described above, the fin isolation dielectrics traverse the width of the fins; and as such, the fin isolation dielectrics are adjacent first sidewalls of the fins, continue through the body of the fins, and are adjacent second sidewalls of the fins, wherein the first sidewalls are opposite the second sidewalls.

Additionally, prior to the forming of the gate electrode, in item 850, a back-gate electrode is formed between a first fin and a second fin, such that the back-gate electrode contacts the doped substrate region. As described above, sidewalls of the back-gate electrode contact back-gate dielectrics; and, a top surface of the back-gate electrode is above top surfaces of the fins.

Following this, in item 860, a gate electrode is formed covering the channel region and at least a portion of the isolation region. Thus, as described above, the gate electrode is adjacent to the isolation region. This includes, in item 862, forming the gate electrode such that the gate electrode comprises a lower portion below the channel region of the fin, and such that the lower portion of the gate electrode comprises a height that is at least one-half of a thickness of the fin. As described above, the structure could include an isolation oxide on portions of the top surface of the substrate that are not covered by the gate isolation dielectric. Thus, sidewalls of the isolation oxide contact sidewalls of the gate electrode. Furthermore, in item 864, the forming of the gate electrode forms the gate electrode such that it covers at least a portion of the fin isolation dielectric.

Figure 9:
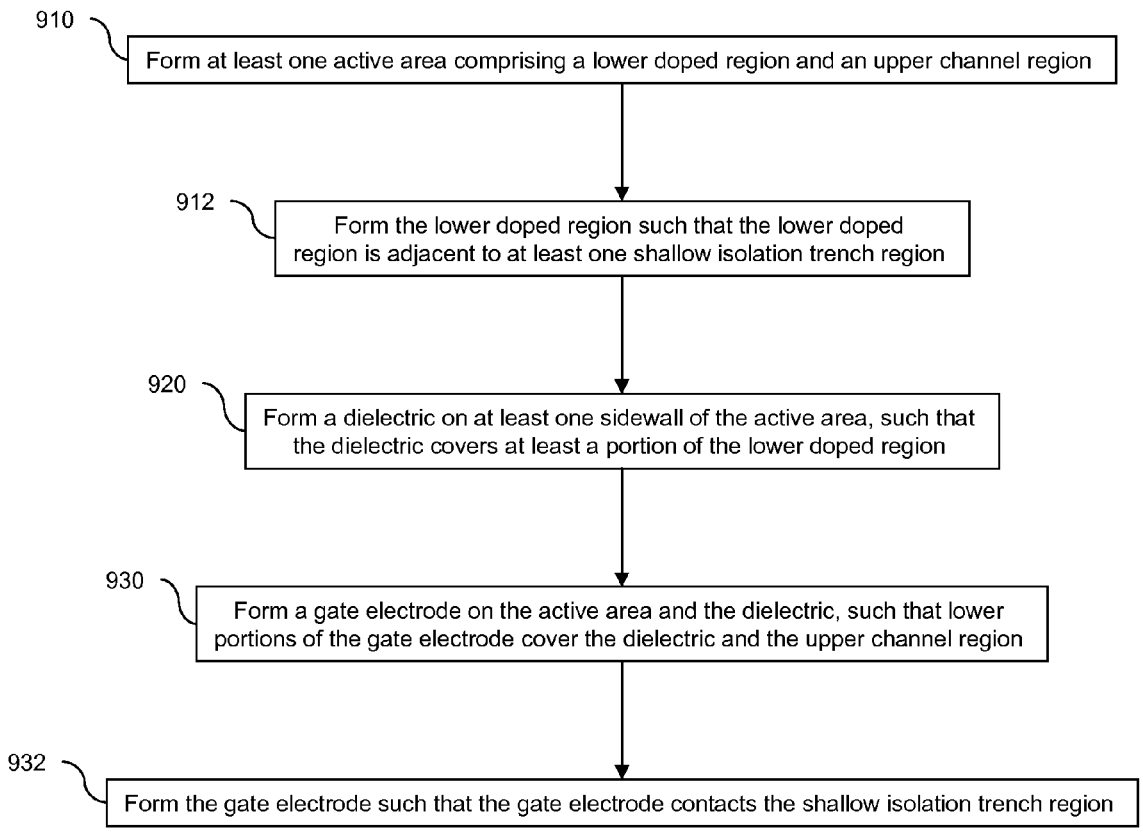
FIG. 9 is a flow diagram illustrating another method of forming a rad-hard FinFET.

FIG. 9 is a flow diagram illustrating another method of forming a rad-hard FinFET. The method begins in item 910 by forming at least one fin comprising a lower doped region and an upper channel region. This includes, in item 912, forming the lower doped region such that the lower doped region is adjacent to at least one shallow isolation trench region. As described above, FIG. 5 illustrates a top view of a rad-hard CMOS structure, wherein at least one nFET and at least one pFET are on an isolation region, and wherein an STI region is between the nFET and the pFET.

Following this, in item 920, a dielectric is formed on at least one sidewall of the fin, such that lower portions of the dielectric cover at least a portion of the lower doped region. As described above, the sidewall dielectrics overlap a border between the heavily doped regions and the remaining upper portions of the fins. The method, in item 930, also forms a gate electrode on the fin and the dielectric, such that lower portions of the gate electrode cover the lower portions of the dielectric and the upper channel region. As described above, the gates are adjacent (proximate, cover, etc.) at least a portion of the heavily p-doped region and the heavily n-doped region. Moreover, the gates overlap a border between the heavily doped regions and the remaining upper portions of the fins. This involves, in item 932, forming the gate electrode such that the gate electrode contacts the shallow isolation trench region.

Accordingly, features are introduced to FinFET technology to suppress degradation caused by exposure to various forms of ionizing radiation. In particular, regions that can accumulate charge and affect the channel potential are minimized by design. Furthermore, three elements which result in suppression of radiation-induced degradation are provided. First, a highly doped lower portion of the silicon sidewall adjacent to the STI is provided. Second, a sidewall dielectric region which overlaps at least a portion of the highly doped lower portion of the silicon sidewall is shown. Next, a continuation of the gate electrode from the top of the STI region downward sufficiently to overlap at least a portion of the sidewall dielectric region and at least a portion of the highly doped lower portion of the silicon sidewall is provided. This structure, applicable to both nFETs and pFETs, eliminates any thick oxide regions adjacent to lightly doped channel regions, hence augmenting resistance to radiation-induced degradation.

Accordingly, features are introduced to FinFET technology to suppress degradation caused by exposure to various forms of ionizing radiation. In particular, regions that can accumulate charge and affect the channel potential are minimized by design. Furthermore, three elements which result in suppression of radiation-induced degradation are provided. First, a highly doped lower portion of the silicon sidewall adjacent to the STI is provided. Second, a sidewall dielectric region which overlaps at least a portion of the highly doped lower portion of the silicon sidewall is shown. Next, a continuation of the gate electrode from the top of the STI region downward sufficiently to overlap at least a portion of the sidewall dielectric region and at least a portion of the highly doped lower portion of the silicon sidewall is provided. This structure, applicable to both nFET and pFET, eliminates any thick oxide regions adjacent to lightly doped channel regions, hence augmenting resistance to radiation-induced degradation.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A semiconductor structure, comprising:
    a plurality of active area fin structures, each fin structure comprising a channel region being an upper fin portion of said fin structure in contact with an isolation region being a lower fin portion of said fin structure;
    a doped substrate region disposed completely below said plurality of active area fin structures, wherein said isolation region contacts said doped substrate region; and
    a gate electrode covering top and side portions of said channel region and at least a portion of side portions of said isolation region; and
    a back-gate electrode disposed between a first active area fin structure and a second active area fin structure of said plurality of active area fin structures, wherein said back-gate electrode is adjacent said doped substrate region,
    wherein said plurality of active area fin structures, said upper fin portion, said lower fin portion, and said back-gate electrode each comprise a height and a width, wherein said height is greater than said width.

2. The structure according to claim 1, further comprising a gate dielectric on a top surface of said channel region and at least one sidewall of said channel region.

3. The structure according to claim 2, further comprising a gate isolation dielectric below said gate dielectric, wherein said gate isolation dielectric is on a portion of at least one sidewall of said isolation region.

4. The structure according to claim 1, further comprising an active area isolation dielectric, wherein said active area isolation dielectric is located in said isolation region.

5. The structure according to claim 4, wherein said gate electrode covers at least a portion of said active area isolation dielectric.

6. A semiconductor structure, comprising:
    at least one fin comprising a lower doped isolation region fin portion and an upper channel region fin portion in contact with said lower doped isolation region fin portion;
    a dielectric on at least one sidewall of said fin, wherein said dielectric contacts and covers at least a portion of said lower doped isolation region; and
    a gate electrode on said fin and said dielectric, wherein said gate electrode covers said dielectric and said upper channel region,
    wherein said fin, said upper channel region fin portion and said lower doped isolation region fin portion each comprise a height and a width where said height is greater than said width.

7. The structure according to claim 6, wherein said lower doped region is adjacent to at least one shallow isolation trench region.

8. The structure according to claim 7, wherein said gate electrode contacts said at least one shallow isolation trench region.

9. A semiconductor structure, comprising:
    at least one active area mesa structure comprising a channel region being an upper mesa portion of said mesa structure positioned above and in contact with a lower isolation region being a lower mesa portion of said mesa structure;
    a doped substrate region disposed completely below said active area mesa structure, wherein said isolation region contacts said doped substrate region; and
    a gate electrode covering top and side portions of said channel region and at least a portion of side portions of said isolation region,
    wherein said active area mesa structure, said upper mesa portion and said lower mesa portion each comprise a height and a width, wherein said width is greater than said height.

10. The structure according to claim 9, further comprising a gate dielectric on a top surface of said channel region, at least one sidewall of said channel region.

11. The structure according to claim 10, further comprising a gate isolation dielectric below said gate dielectric, wherein said gate isolation dielectric is on a portion of at least one sidewall of said isolation region.

12. The structure according to claim 9, further comprising an active area isolation dielectric, wherein said active area isolation dielectric is said isolation region.

13. The structure according to claim 12, wherein said gate electrode covers at least a portion of said active area isolation dielectric.

14. The structure according to claim 9, further comprising a back-gate electrode between a first active area and a second active area, wherein said back-gate electrode contacts said doped substrate region.

* * * * *